*(12)* United States Patent
Kakuta et al.

(10) Patent No.: US 10,468,322 B2
(45) Date of Patent: Nov. 5, 2019

(54) SEMICONDUCTOR DEVICE CAPABLE OF SUPPRESSING CRACKS OF THROUGH-HOLE PROTECTIVE FILM AND SHORT CIRCUIT OF ADJACENT THROUGH-ELECTRODES

(71) Applicant: DENSO CORPORATION, Kariya, Aichi-pref. (JP)

(72) Inventors: Kazuyuki Kakuta, Kariya (JP); Hisanori Yokura, Kariya (JP); Minoru Murata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/078,131

(22) PCT Filed: Feb. 23, 2017

(86) PCT No.: PCT/JP2017/006898
§ 371 (c)(1),
(2) Date: Aug. 21, 2018

(87) PCT Pub. No.: WO2017/150343
PCT Pub. Date: Sep. 8, 2017

(65) Prior Publication Data
US 2019/0051575 A1   Feb. 14, 2019

(30) Foreign Application Priority Data

Mar. 3, 2016   (JP) .................................. 2016-41427

(51) Int. Cl.
*H01L 23/31*   (2006.01)
*H01L 21/3205*   (2006.01)
(Continued)

(52) U.S. Cl.
CPC ........ *H01L 23/3192* (2013.01); *G01L 9/0042* (2013.01); *G01L 9/0054* (2013.01);
(Continued)

(58) Field of Classification Search
CPC ........... H01L 21/02126; H01L 21/0217; H01L 21/02271; H01L 21/0273; H01L 21/266;
(Continued)

(56) References Cited

U.S. PATENT DOCUMENTS 8,334,599 B2 * 12/2012 Bruennert ............. H01L 23/481
257/686
9,287,140 B2 * 3/2016 Chung .................. H01L 21/486
(Continued)

FOREIGN PATENT DOCUMENTS

JP    2011-165983 A    8/2011
JP    2012-009473 A    1/2012
(Continued)

*Primary Examiner* — Andrew Q Tran
(74) *Attorney, Agent, or Firm* — Posz Law Group, PLC

(57) ABSTRACT

A semiconductor device includes: a first substrate having connectors at a first surface; a second substrate bonded with the first substrate having through-holes in a stacking direction of the first and second substrates for respectively exposing the connectors; through-electrodes respectively arranged at through-holes and electrically connected with the connectors; and a protective film for integrally covering the through-electrodes. Frame-shaped slits are formed to respectively surround the through-holes when viewed in a normal direction with respect to the first surface of the first substrate. The protective film is separated by the slit into a region inside the slit and a region outside the slit.

5 Claims, 7 Drawing Sheets

(51) Int. Cl.
*H01L 21/768* (2006.01)
*H01L 29/84* (2006.01)
*G01L 9/00* (2006.01)
*H01L 21/02* (2006.01)
*H01L 21/027* (2006.01)
*H01L 21/266* (2006.01)
*H01L 21/3065* (2006.01)
*H01L 21/311* (2006.01)
*H01L 21/324* (2006.01)
*H01L 21/56* (2006.01)
*H01L 23/48* (2006.01)
*H01L 23/528* (2006.01)
*H01L 23/60* (2006.01)
*H01L 23/544* (2006.01)

(52) U.S. Cl.
CPC ...... *H01L 21/0217* (2013.01); *H01L 21/0273* (2013.01); *H01L 21/02126* (2013.01); *H01L 21/02271* (2013.01); *H01L 21/266* (2013.01); *H01L 21/3065* (2013.01); *H01L 21/31116* (2013.01); *H01L 21/324* (2013.01); *H01L 21/3205* (2013.01); *H01L 21/565* (2013.01); *H01L 21/768* (2013.01); *H01L 21/76802* (2013.01); *H01L 21/76898* (2013.01); *H01L 23/3171* (2013.01); *H01L 23/481* (2013.01); *H01L 23/528* (2013.01); *H01L 23/60* (2013.01); *H01L 29/84* (2013.01); *H01L 23/544* (2013.01); *H01L 2223/54426* (2013.01)

(58) Field of Classification Search
CPC ........... H01L 21/3065; H01L 21/31116; H01L 21/3205; H01L 21/324; H01L 21/565; H01L 21/768; H01L 21/76802; H01L 21/76898; H01L 23/3171; H01L 23/3192; H01L 23/481; H01L 23/528; H01L 23/60; H01L 29/84; H01L 23/562; G01L 9/0042; G01L 9/0054
See application file for complete search history.

(56) References Cited

U.S. PATENT DOCUMENTS

| | | | |
|---|---|---|---|
| 9,679,867 B2 * | 6/2017 | Ashidate | ................ H01L 24/05 |
| 2009/0001602 A1 | 1/2009 | Chung | |
| 2011/0033980 A1 | 2/2011 | Chung | |
| 2011/0204487 A1 | 8/2011 | Nakano et al. | |
| 2012/0139127 A1 | 6/2012 | Beyne | |
| 2016/0187215 A1 | 6/2016 | Kawano et al. | |

FOREIGN PATENT DOCUMENTS

| | | |
|---|---|---|
| JP | 2012-253182 A | 12/2012 |
| JP | 2013-098308 A | 5/2013 |

* cited by examiner

SEMICONDUCTOR DEVICE CAPABLE OF SUPPRESSING CRACKS OF THROUGH-HOLE PROTECTIVE FILM AND SHORT CIRCUIT OF ADJACENT THROUGH-ELECTRODES

CROSS REFERENCE TO RELATED APPLICATIONS

This application is the U.S. national phase of International Application No. PCT/JP2017/006898 filed on Feb. 23, 2017 and is based on Japanese Patent Application No. 2016-41427 filed on Mar. 3, 2016, the disclosures of which are incorporated herein by reference.

TECHNICAL FIELD

The present disclosure relates to a semiconductor device. The semiconductor device has a first substrate and a second substrate. Both of the first and second substrates are joined together. A through-electrode, which is electrically connected with a connector formed at the first substrate, is formed at the second substrate.

BACKGROUND

Patent Literature 1 discloses a pressure sensor having first and second substrates, as a semiconductor device. The first substrate has first and second surfaces. The first surface is provided with a gauge resistor and a plurality of wirings. The wirings are connected to the gauge resistor. A recess is formed from the second surface of the first substrate to reduce the thickness of the first substrate where the gauge resistor is arranged. In addition, the second substrate has a hollow cavity, which is opposite to the first substrate where the gauge resistor is arranged. The second substrate is bonded with the first substrate so as to seal the gauge resistor inside the hollow cavity.

A plurality of through-electrodes are formed on the second substrate that penetrate in a stacking direction of the first substrate and the second substrate, and allow each one of the plurality of connectors formed on the first substrate to be exposed. Each of the plurality through-electrodes is arranged at each through-hole, and the through-electrode is electrically connected with the connector exposed form the through-hole. Moreover, a protective film is integrally arranged with the second substrate so as to cover the through-electrode.

PRIOR ART LITERATURES

Patent Literature

Patent Literature 1: JP 2015-52588 A

SUMMARY

With regard to the above-mentioned semiconductor device, in a situation where the through-electrode is connected with an external circuit, it is aimed to make a connection between a gauge resistor and an external circuit through the connector formed at the through-electrode and the first substrate. However, as the present inventors review this type of semiconductor device, it is discovered that a stress is concentrated on the border portion, which is between the bottom surface and side surface of the through-hole, of the protective film. Subsequently, the inventors found out that the crack may occur where the stress is concentrated. Furthermore, the inventors found out that, when the crack occurs on the protective film arranged at the through-hole, the crack extends to the protective film covering the adjacent through-electrode. In this situation, the semiconductor device is in a state where the adjacent electrodes are exposed by the common crack; therefore, a foreign substance such as water may enter through this crack and then a short circuit is formed between the adjacent through-electrodes.

It is an object of the present disclosure to provide a semiconductor device for preventing a short circuit formed between adjacent through-electrodes.

According to an aspect of the present disclosure, a semiconductor device has a first substrate and a second substrate bonded together. The semiconductor device includes: the first substrate having a first surface at which a plurality of connectors are arranged; the second substrate including a first surface and a second surface at a side opposite to the first surface of the second substrate, the second substrate stacked on the first substrate by bonding the first surface of the second substrate and the first surface of the first substrate together, the second substrate including a plurality of through-holes correspondingly exposing the connectors, each through-hole in a stacking direction of the first substrate and the second substrate; a plurality of through-electrodes correspondingly arranged at the through-holes, the through-electrodes electrically connected with the connectors correspondingly; and a protective film integrally covering the through-electrodes. Additionally, the protective film has a plurality of slits, each slit having a frame shape to surround an opening of the each through-hole when viewing in a normal direction with respect to the first surface of the first substrate. Furthermore, the protective film is separated by the slit into a region inside the slit and a region outside the slit.

Accordingly, even though the crack occurs at the protective film arranged at the border region between the bottom surface and the side surface of the through-hole and then the extension of the crack occurs, the extension of the crack can be blocked by the slit. Therefore, the exposure of the adjacent through-electrodes due to the common crack can be inhibited. In addition, a short circuit formed between the adjacent through-electrodes can be inhibited.

DESCRIPTION OF EMBODIMENTS

Figure 1:
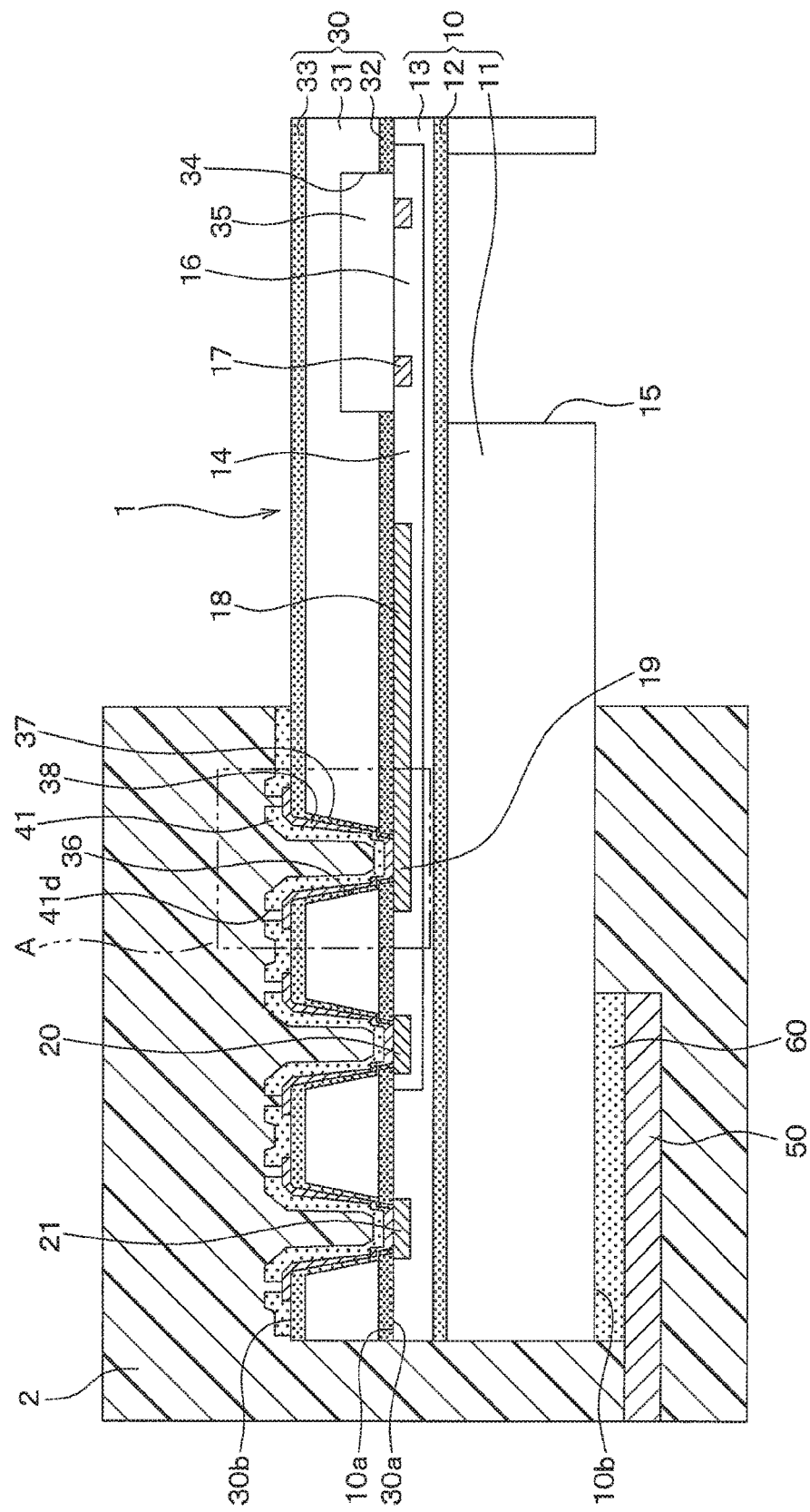
FIG. 1 is a cross-sectional view of a semiconductor device according to a first embodiment.

The following describes several embodiments of the present disclosure with reference to the drawings. It is to be noted that like reference numerals designate identical or corresponding components throughout the following embodiments.

First Embodiment

A first embodiment is described in the following with reference to the drawings. The present embodiment describes an example in which a semiconductor device is applied to a pressure sensor. It is noted that the pressure sensor as the semiconductor may be, for example, mounted on an automobile to detect the pressure of gas emitted from an oil pump.

As illustrated in FIG. 1, the semiconductor device includes a sensor 1 and a molded resign 2 which seals the sensor 1 for support. First of all, the configuration of the sensor 1 according to the present embodiment 1 is described in the following.

The sensor 1 includes a sensor substrate 10 that has a first surface 10a and a second surface 10b at a side opposite to the first surface 10a. In the present embodiment, a support substrate 11, an insulation film 12 and a semiconductor layer 13 are stacked in order, and configured by an SOI (Silicon on Insulator) substrate having a rectangular shape in a plan view in one direction as the longitudinal direction (in other words, in a left-right direction viewed on the sheet of FIG. 1). The sensor substrate 10 has: one surface of the semiconductor layer 13 at a side opposite to the insulation film configured as the first surface 10a of the sensor substrate 10; and another surface of the support substrate 11 at a side opposite to the insulation film 12 configured as the second surface 10n of the sensor substrate 10. In the present embodiment, the semiconductor layer 13 is configured by, for example, a p-type silicon substrate. With regard to the present embodiment, the sensor substrate 10 corresponds to a first substrate.

The sensor substrate 10 has an N-type layer 14 on a surface layer of the semiconductor layer 13. A recess 15 is formed from the second surface 10b on one end side of the sensor substrate 10 in the longitudinal direction (in other words, at the end portion located at right side of the sheet of FIG. 1). A diaphragm 16 is formed at the sensor substrate 10 by having the formation of the recess 15.

In this embodiment, the recess 15 reaches the insulation film 12 from the second surface 10b of the sensor substrate 10. In other words, the recess 15 is formed on the support substrate 11. The insulation film 12 and the semiconductor layer 13 are located between the bottom surface of the recess 15 and the first surface 10a of the sensor substrate 10. The diaphragm 16 is configured at the insulation film 12 and the semiconductor layer 13.

A gauge resistor 17, which has a resistance value varied with the deformation of the diaphragm 16, is arranged at the diaphragm 16. In this embodiment, four gauge resistors 17 are arranged, and are properly connected by the connection wiring layer (not shown) so as to configure a bridge circuit. Accordingly, a sensor signal is output based on the deformation of the diaphragm 16. It is noted that only two gauge resistors 17 are illustrated in FIG. 1.

A lead wiring layer 18 is formed on the semiconductor layer 13. The lead wiring layer 18 is electrically connected with the gauge resistor 17. The lead wiring layer 18 is led from a part connected with the gauge resistor 17 towards the other end of the semiconductor layer 13 in the longitudinal direction (in other words, the end side at the left side of the sheet of FIG. 1). In this embodiment, four lead wiring layers 18 are arranged. One of the lead wiring layers 18 is configured to apply the respective power source voltages. Another one of the lead wiring layers 18 is configured to connect to a ground. The remaining two of the lead wiring layers 18 are configured to output a middle point voltage of the bridge circuit. It is noted that only one lead wiring layer 18 is illustrated in FIG. 1.

The end of the lead wiring layer 18 at a side opposite to another end connected with the gauge resistor 17 is configured as a connector (hereinafter referred to as a first connector 19) for leading wire electrically connected with the after-mentioned through electrode 38.

The first connector 19 has a circular shape in a plan view facing the after-mentioned through-hole 36. In addition, the gauge resistor 17, the connection wiring layer, lead wiring layer 18, and the first connector 19 are configured by, for example, a diffusion layer for diffuse p-type impurities, and are formed inside the N-type layer 14.

An N+ type connector for the N-type layer (hereinafter referred to as a second connector 20) having a concentration higher than the concentration of the N-type layer 14 is arranged inside the N-type layer 14 of the semiconductor layer 13. The second connector 20 is located at the other end of the substrate sensor 10 with respect to the first connector 19. The second connector 20 is connected electrically to the through-electrode 38 for maintaining the N-type layer 14 at a predetermined potential level.

A P+ type connector for the P+ type semiconductor layer 21 (hereinafter referred to as a third connector) is arranged at the outer side of the N-type layer 14 as the other end side of the semiconductor layer 13 with respect to the second connector 20. The P+ type semiconductor layer has a higher concentration than the concentration of the semiconductor layer 13. The third connector 21 is connected electrically with the after-mentioned through electrode 38 for maintaining the semiconductor layer 13 at a predetermined potential level. It is noted that the second connector 20 and the third connector 21 respectively have a circular shape in a plan view facing the after-mentioned through-hole 36.

As illustrated in FIG. 1, a cap substrate 30 is stacked on the first surface 10a of the sensor substrate 10. The cap substrate 30 includes: a substrate 31 made of, for example, silicon; an insulation film 32 formed on a side of one surface of the substrate 31 opposite to the sensor substrate 10; and an insulation film 33 formed on the other surface of the substrate 31 opposite to the one surface of the substrate at the insulation film 32 side. In the present embodiment, the cap substrate 30 corresponds to the second substrate.

With regard to the cap substrate 30, the insulation film 32 is bonded to the semiconductor layer 13 at the sensor substrate 10. In the present embodiment, the cap substrate 30 and the sensor substrate 10 are bonded together by, for example, direct binding in which the respective binding surfaces of the insulation film 32 and the semiconductor layer 13 are activated to be bonded.

In the present embodiment, the cap substrate 30 has one surface of the insulation film 32 at a side opposite to the substrate 31 that is configured as a first surface 30a of the cap substrate 30, and has one surface of the insulation film 33 at a side opposite to the substrate 31 that is configured as a second surface 30b of the cap substrate 30.

A hollow part 34 is arranged at the cap substrate 30 facing the diaphragm 16 at the first surface 30a of the cap substrate 30. A reference pressure chamber 35 is configured by the hollow part 34 between the sensor substrate 10 and the cap substrate 30. The reference pressure is applied from the reference pressure chamber 35 towards the first surface 10a side at the diaphragm 16. In the present embodiment, the reference pressure chamber 35 is in a vacuum state.

Figure 2:
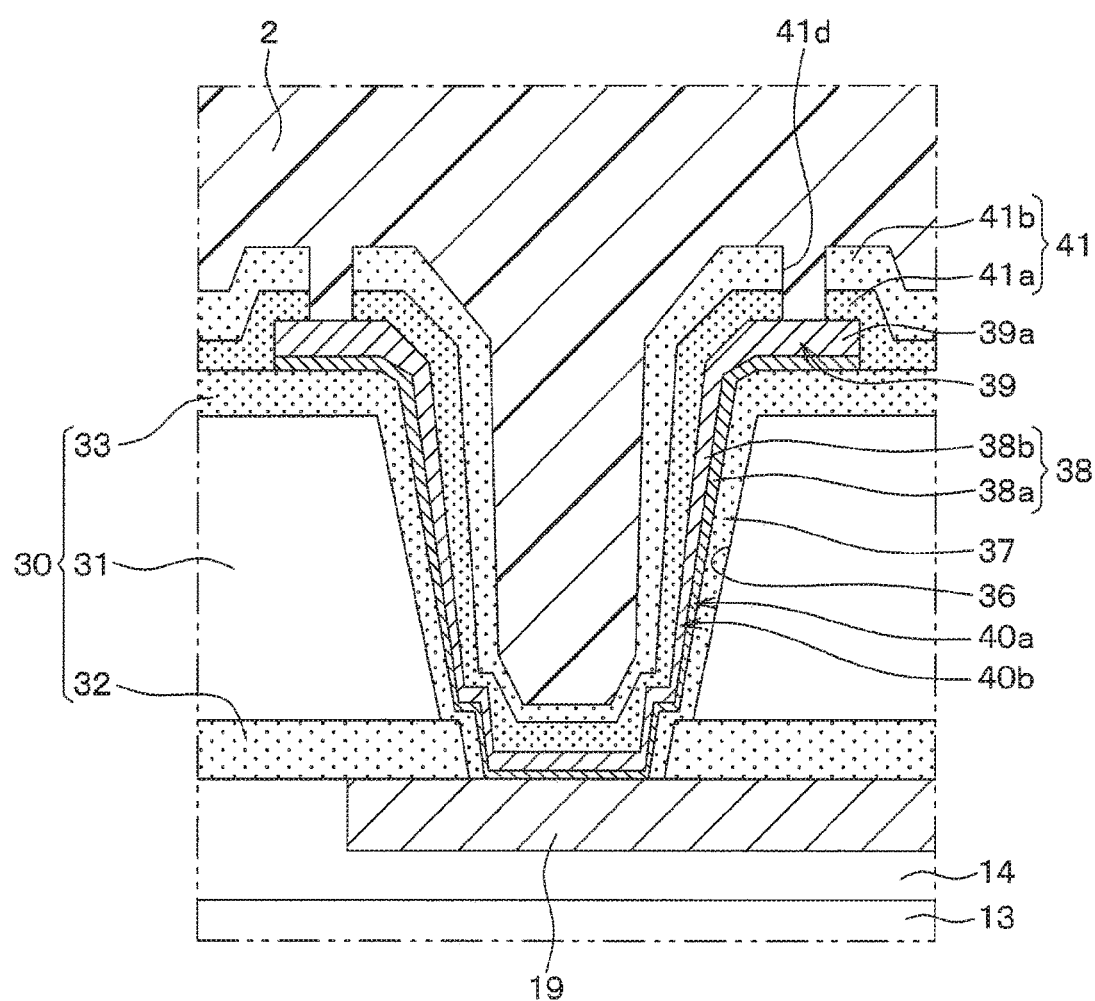
FIG. 2 is an enlarged view of a region A in FIG. 1.

As illustrated in FIGS. 1 and 2, six through-holes 36 respectively having a cylindrical shape penetrate the cap substrate 30 in the stacking direction of the sensor substrate 10 and the cap substrate 30 at a side of the other end of the cap substrate 30 (in other words, the left side of the sheet of FIG. 1). In particular, four of the six through-holes 36 configured for exposing the first connector 19, one through-hole 36 for exposing the second connector 20 and one through-hole 36 for exposing the third connector 21 are arranged at the cap substrate 30.

It is noted that only the one of the through-holes 36 for exposing the first connector 19 is illustrated in FIG. 1. Since each through-hole 36 is formed by, for example, dry etching, the through-hole 36 has a taper shape, of which the diameter becomes shorter from the opening to the bottom.

An insulation film 37 is arranged at the wall surface of the through-hole 36. The insulation film 37 is configured by, for example, TEOS (Tetra Ethyl Ortho Silicate). In addition, the through-electrode 38 is arranged on the insulation film 37. The through-electrode 38 is configured to electrically connect with the first connector 19, the second connector 20 or the third connector 21 as appropriate.

Figure 3:
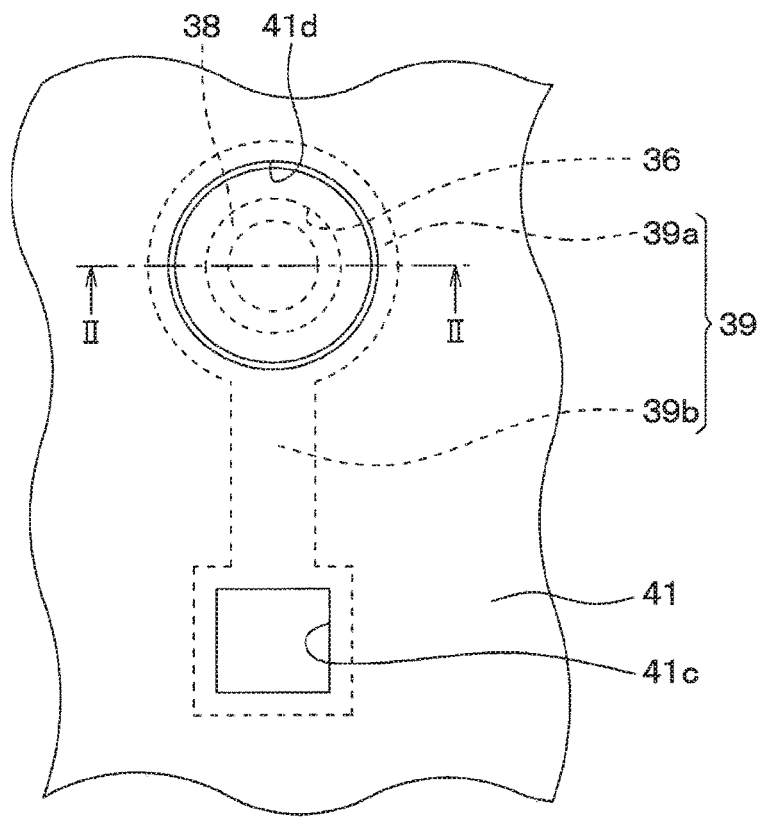
FIG. 3 is a plan view of the vicinity of a through-hole illustrated in FIG. 2.

As illustrated in FIG. 3, a wiring layer 39 is arranged on the second surface 30b of the cap substrate 30. The wiring layer 39 is configured to electrically connect with the through-electrode 38. In the present embodiment, the wiring layer 39 includes a flange 39a arranged around the opening of the through-hole 36 at the second surface of the cap substrate 30, and a lead 39b extended from the flange 39a in one direction.

In the present embodiment, as illustrated in FIG. 2, the through-electrode 38 and the wiring layer 39 are configured by the same metal material. In other words, the wiring layer 39 is formed by the extension of the through-electrode 38. The through-electrode 38 and the wiring layer 39 are configured as a two-layer structure in which a lower metal film 40a and an upper metal film 40b are stacked in order. The lower metal film 40a as a barrier metal configured by AlSiCu, and the upper metal film 40b is configured by Al.

A protective film 41 is arranged on the cap substrate 30. The protective film 41 is configured to cover the through-electrode 38 and the wiring layer 39 integrally. In the present embodiment, the protective film 41, as illustrated in FIG. 2, is configured by two-layer structure in which a lower protective film 41a and an upper protective film 41b are stacked in order. The lower protective film 41a is configured by, for example, TEOS, and the upper protective film 41b is configured to have a moisture transparency lower than that of the lower protective film 41a.

The insulation film 37, the through-electrode 38 and the protective film 41 respectively form film; therefore, the film thickness gets smaller at the bottom of the through-hole 36 where a film is hardly formed.

As illustrated in FIG. 3, a contact hole 41c is formed on the protective film 41. The contact hole 41c is configured to expose lead 39b. The portion of the lead 39b exposed from the contact hole 41 is configured to function as a pad where a bonding wire (not shown) is connected for making electrical connection with an external circuit.

As illustrated in FIGS. 2 and 3, a slit 41d is formed on the protective film 41. In particular, the slit 41d forms a ring shape that surrounds an opening of the through-hole 36 viewed from a normal direction with respect to the first surface 10a of the sensor substrate 10. The slit 41d is formed to reach the flange 39a. In other words, the slit 41d is formed so as to expose the flange 39a in a ring shape. Subsequently, the region in the inner periphery and the region in the outer periphery of the protective film 41 are separated by the slit 41d.

FIG. 3 illustrates a plan view of the vicinity of the through-hole 36 for exposing the first connector 19. FIG. 3 may also be applied to a plan view of the vicinity of the through-hole 36 for exposing the second connector 20 and a plan view of the vicinity of the through-hole 36 for exposing the third connector 21.

The above description refers to the configuration of the sensor 1 according to the present embodiment. As illustrated in FIG. 1, a support member 50 is arranged on other end portion of the sensor substrate 10 at the second surface 10b. The support member 50 is configured to be equipped with the sensor 1 for support. This support member 50 is configured by a lead frame made of, for example, copper or 42alloy.

The other end portion of the sensor 1 and the support member are sealed and fixed by molded resin 2. In other words, the molded resin 2 is arranged at the sensor 1 so as to expose the diaphragm 16 while sealing, for example, the through-electrode 38.

The above description refers to the configuration of the pressure sensor as the semiconductor device according to the present embodiment. With regard to this type of semiconductor device, the N-type layer 14 performs the detection of pressure at a state of having higher potential level than the potential levels of the P-type gauge resistor 17, the connection wiring layer, the lead wiring layer 18 and the first connector 19. In other words, the detection of pressure is performed at a situation where a reverse-bias voltage is applied to a diode configured by the N-type layer 14, P-type gauge resistor 17, the connection wiring layer, the lead wiring layer 18 and the first connector 19.

When the pressure of a measurement medium is applied to the diaphragm 16 at the second surface 10b side, the diaphragm 16 deforms based on the pressure difference between the pressure and the reference pressure applied to the diaphragm 16 at the first surface 10a side, and a sensor signal according to the deformation is output. Accordingly, the pressure of the measurement medium is detected based on the sensor signal.

As mentioned above, the slit 41d is formed on the protective film 41. In particular, the slit 41d forms a ring shape that surrounds an opening of the through-hole 36 viewed from a normal direction with respect to the first surface 10a of the sensor substrate 10. The slit 41d is formed to reach the flange 39a. Accordingly, even though a crack occurs and on the protective film 41 at the border region between the bottom surface and the side surface of the through-hole 36 and the crack further extends, the crack is blocked by the slit 41d. In other words, even though the crack occurs in the region related to the inner periphery of the protective film 41, which is separated from the outer periphery of the protective film 41 by the slit 41d, the situation in which the crack extends to the region of the outer periphery of the protective film 41 can be inhibited. Accordingly, the situation where the adjacent through-holes 38 are exposed due to the common crack can be inhibited, and the situation where a short circuit is formed between the through-holes 38 can also be inhibited.

The present inventors further review the reason why the crack occurs. The present inventors newly found out that the stress occurred at the protective film 41 is dependent on the thickness of the protective film 41 and the thickness of the through-hole 38.

The stress occurred at the protective film 41 refers to the stress occurred at the protective film 41 arranged on the border region between the bottom surface and the side surface of the through-hole 36. In other words, the stress occurred at the protective film 41 refers to the maximum stress occurred at the protective film 41. The film thickness of the upper protective film 41b in FIG. 4 refers to film thickness related to the portion of the upper protective film 41b formed on the bottom surface of the through-hole 36. The thickness of the protective film 41 formed on the bottom surface of the through-hole 36 is substantially the same as the thickness of the protective film 41 formed on the border region between the bottom surface and the side surface of the through-hole 36. Similarly, the film thickness of the through-electrode 38 illustrated in FIG. 5 refers to the film thickness of the through-hole 36 formed on the bottom surface of the through-hole 36. The thickness of the through-electrode 38 formed on the bottom surface of the through-hole 36 is substantially the same as the thickness of the through-electrode 38 formed on the border region between the side surface and the bottom surface of the through-hole 36.

Figure 4:
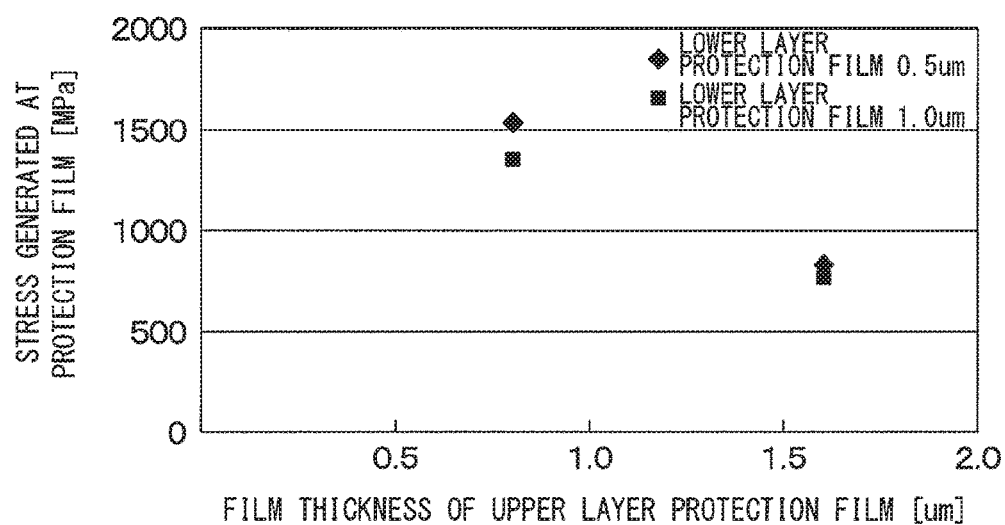
FIG. 4 illustrates a relation between a stress occurred on a protective film and a film thickness of an upper layer protective film on the base surface of the through-hole.
Figure 5:
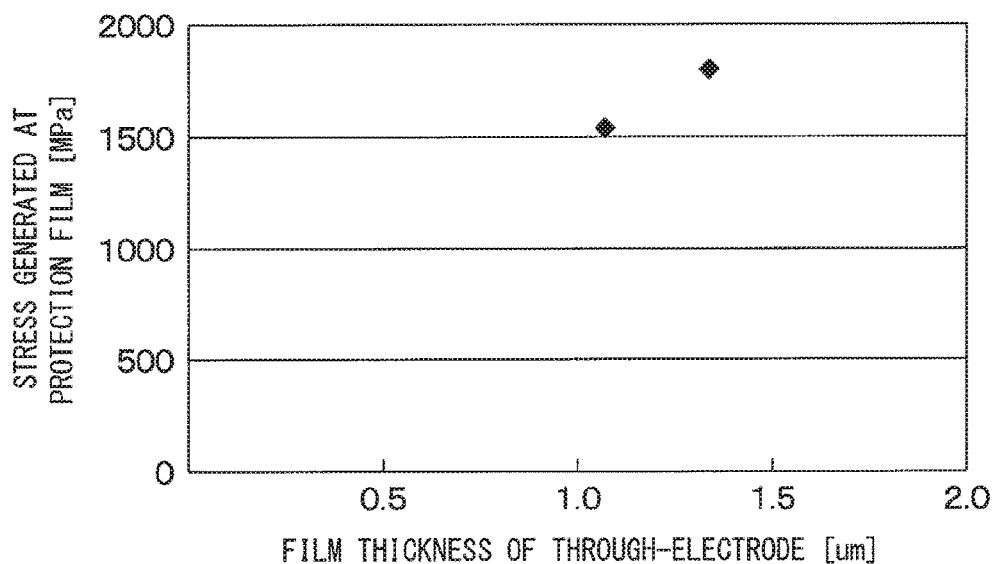
FIG. 5 illustrates a relation between a stress occurred on the protective film and a film thickness of a through-electrode arranged on the bottom surface of the through-hole.

As illustrated in FIG. 4, the present inventors found out that the stress occurred at the protective film 41 gets smaller as the protective film 41 formed on the bottom surface of the through-hole 36 gets thicker. As illustrated in FIG. 5, the present inventors found out that the stress occurred at the protective film 41 gets larger as the through-electrode 38 formed at the bottom surface of the through-hole 36 gets thicker. FIG. 5 illustrates the film thickness of the lower metal film 40a being 0.1 µm and illustrates the film thickness of the upper metal film 40b being modified. However, it yields the same result in a situation where the film thickness of the upper metal film 40b is kept the same and the film thickness of the lower metal film 40a is modified.

Figure 6:
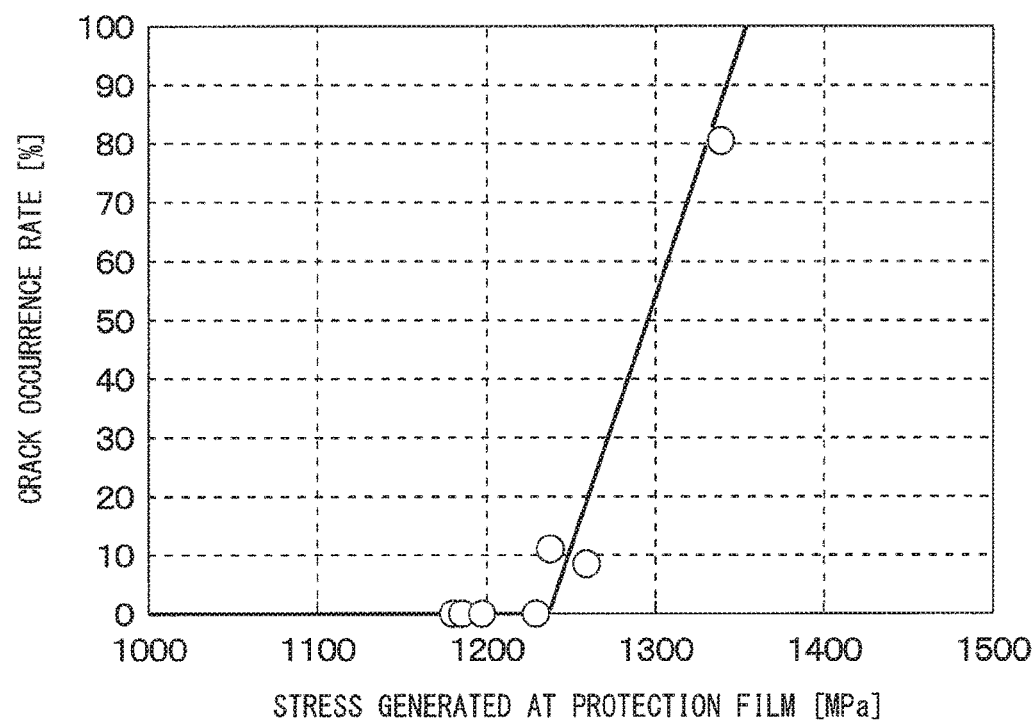
FIG. 6 illustrates a relation between crack incidence rate and the stress occurred on the protective film.

The present inventor also reviewed the probability of further having the crack after the stress occurs at the protective film 41 illustrated in FIGS. 4 and 5, and yields the result as illustrated in FIG. 6. That is, as illustrated in FIG. 6, the present inventor confirms that the crack occurs when the stress is at 1240 MPa. Accordingly, the present embodiment may also be applied to the semiconductor device in which the stress occurred at the protective film 41 is above 1240 MPa.

The following describes a manufacturing method of the semiconductor device according to the present embodiment.

First of all, the sensor substrate 10, at which the support substrate 11, the insulation film 12 and the semiconductor layer 13 are stacked in order, is prepared. Subsequently, impurities is injected through ion-injection into the sensor substrate 10 at the first surface 10a side by using a mask (not shown) and a heating process is performed for diffusing the impurities. Accordingly, the N-type layer 14, the gauge resistor 17, the lead wiring layer 18, the first connector 19, the second connector 20, the third connector 21 and the like are formed at the sensor substrate 10 as appropriate.

In another process different from the process for preparing the sensor substrate 10, the insulation film 32 is formed on the substrate 31 through, for example, CVD (Chemical Vapor Deposition), and the hollow part 34 is formed through, for example, dry etching.

Subsequently, the sensor substrate 10 and the substrate 31 are bonded together. In this binding process, Ar-ion beam is irradiated on the semiconductor layer 13 of the sensor substrate 10 and the insulation film 32, and each binding surface is activated. Subsequently, with the use of an alignment mark properly provided at the sensor substrate 10 and the substrate 31, the alignment is performed by, for example, an infrared microscope, and the sensor substrate 10 and the substrate 31 are bonded together by the so-called direct binding for carrying out binding at the lower temperature in a range from an ambient temperature to 550°. Accordingly, the reference pressure chamber 35, which includes space between the sensor substrate 10 and the hollow part 34 of the substrate 31, is configured, and the gauge resistor 17 or the like is sealed at the reference pressure chamber 35.

Subsequently, for making the first connector 19, the second connector 20 and the third connector 21 to be exposed, the through-hole 36, which penetrates the substrate 31 and the insulation film 32 by, for example, dry etching, is formed. The insulation film 37 made of, for example, TEOS, is formed on the wall surface of each through-hole 36. In this situation, the insulation film 33 is formed at the insulation film formed at the first surface of the substrate 31 at a side opposite to the sensor substrate 10. In other words, the cap substrate 30 having the substrate 31, the insulation film 32 and the insulation film 33 is configured.

Next, the insulation film 37 formed at the bottom of each through-hole 36 is removed. The through-electrode 38, which is electrically connected with the first connector 19, the second connector 20 and the third connector 21 at the respective through-holes 36, is formed by, for example, sputtering or vapor deposition, and the metal film is formed on the insulation film 33. In the present embodiment, the lower metal film 40a and the upper metal film 40b are formed in order. Subsequently, the lower metal film 40a and the upper metal film 40b formed on the insulation film 33 are treated with patterning, and the wiring layer 39 having the flange 39a and the lead 39b is formed.

Subsequently, the protective film 41 is formed to cover the through-electrode 38 and the wiring layer 39. In the present embodiment, a SiN film for configuring the upper protective film 41b is formed after a TEOS film for configuring the lower protective film 41a is formed.

A photoresist is arranged on the protective film 41, and the patterning of the photoresist is carried out. Subsequently, the contact hole 41c and the slit 41d are formed on the protective film 41 in a situation where the photoresist is configured as the mask. Accordingly, the sensor 1 is manufactured. It is noted that, in the present embodiment, since the contact hole 41c and the slit 41d are formed together to reach the wiring layer 39, the contact hole 41c and the slit 41d are formed by the common process.

Subsequently, the semiconductor device is manufactured by arranging the support member 50 at the sensor 1 and sealing, for example, the sensor 1 and the support member 50 by the molded resin 2.

It is noted that the manufacturing method of one semiconductor device is described above. However, the sensor substrate 10 having a wafer shape and the substrate 31 may be provided, and each of the above-mentioned processes is performed. Subsequently, the sensor substrate 10 and the substrate 31 may be divided in a chip unit by carrying out dicing saw.

As described above, a slit 41d is formed on the protective film 41. In particular, the slit 41d forms a ring shape that surrounds an opening of the through-hole 36 viewed from a normal direction to the first surface 10a of the sensor substrate 10. The slit 41d is formed to reach the flange 39a. Accordingly, even though the crack occurs in the region related to the inner periphery of the protective film 41, which is separated from the outer periphery of the protective film 41 by the slit 41d, the situation in which the crack extends to the region of the outer periphery of the protective film 41 can be inhibited. Accordingly, the situation where the adjacent through-holes 38 are exposed due to the common crack can be inhibited, and the situation where a short circuit is formed between the through-holes 38 can also be inhibited.

Second Embodiment

A second embodiment is described herein. The present embodiment describes the modification of a location where the slit 41d is formed. Other than that, the second embodiment is similar to the first embodiment. Therefore, the description of the common features in the first and second embodiments is omitted.

Figure 7:
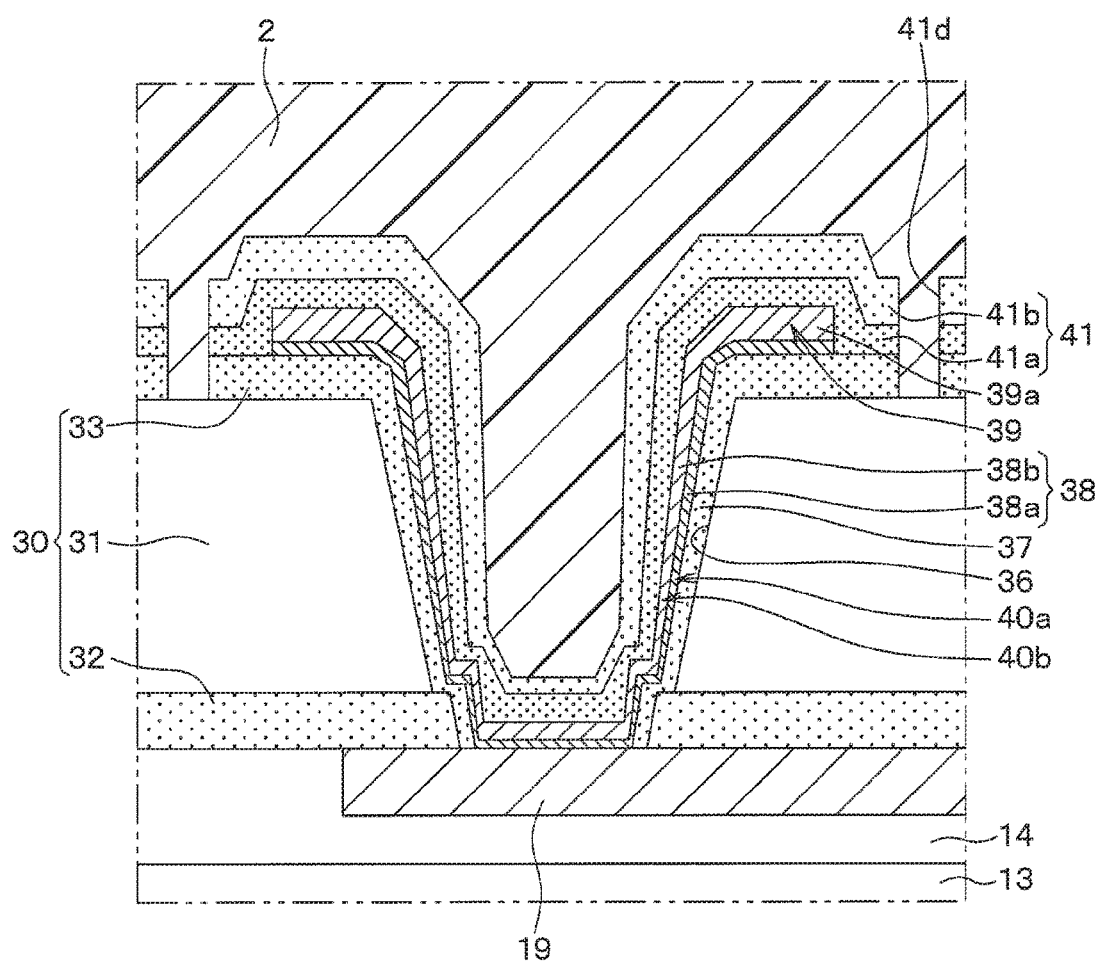
FIG. 7 is a cross sectional view of the vicinity of a through-hole according to a second embodiment.
Figure 8:
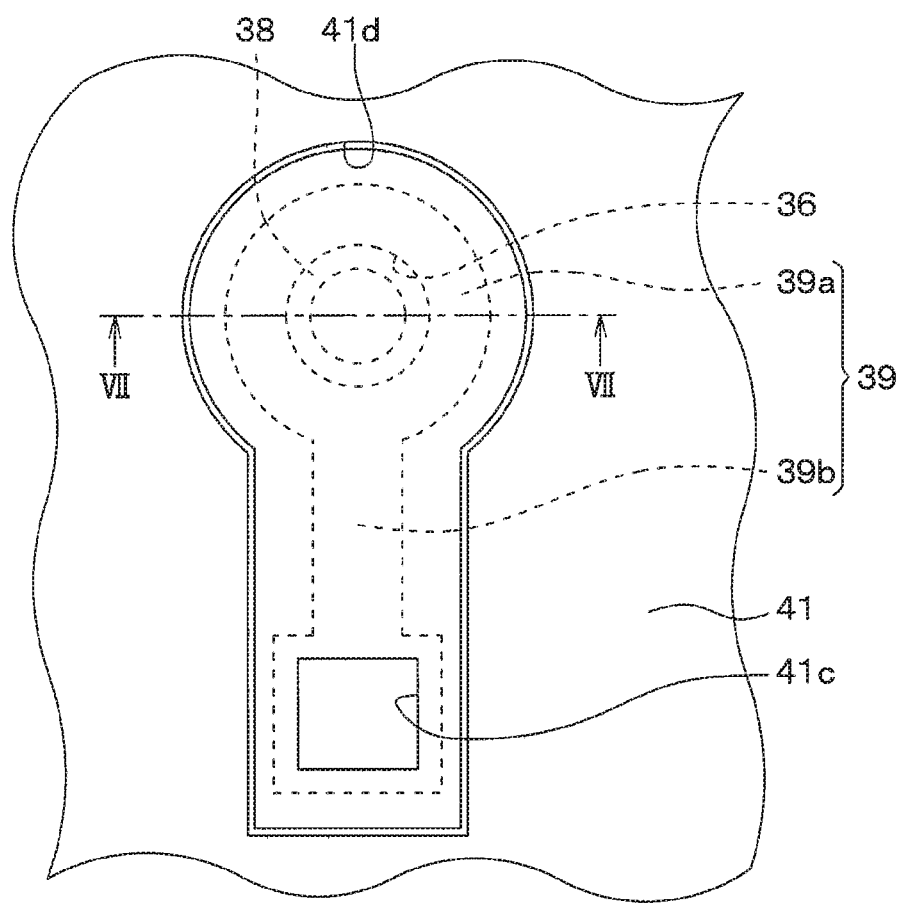
FIG. 8 is a plan view of the vicinity of the through-hole illustrated in FIG. 7.

In this embodiment, as illustrated in FIGS. 7 and 8, the slit 41d is formed at the protective film 41 to surround the wiring layer 39 viewed in a normal direction with respect to the first surface 10a of the sensor substrate 10. In the present embodiment, the lower protective film 41a and the insulation film 33 are configured by TEOS as the same material. In a situation where the crack occurs at the lower protective film 41a, the crack might be conducted to the insulation film 33. Accordingly, the slit 41d is formed to penetrate the lower protective film 41a and the insulation film 33 to reach the substrate 31. In other words, the slit 41d is formed to expose the substrate 31 in a frame shape. In the present embodiment, the lower protective film 41a corresponds to the protective film 41 in contact with the insulation film 33. In addition, FIG. 7 corresponds to an enlarged view of the region A in FIG. 1, and corresponds to a VII-VII cross-section view in FIG. 8.

Thus, in a situation where the slit 41d is formed to surround the wiring layer 39, it is possible to achieve the same result as generated in the first embodiment.

With regard to this type of semiconductor device, since the slit 41d is formed to surround the wiring layer 39, the adjacent wiring layer 29 is isolated by air isolation. Accordingly, the parasitic capacitance generated between the adjacent wiring layers 39 is reduced so that the lowering of the reliability due to the parasitic capacitance can be inhibited.

In a situation where the slit 41d is formed at the vicinity of the through-electrode 38, it is possible to have a defect of shape of the slit such that the slit 41d is not formed to surround the opening of the through-hole 36 by having, for example, a positional misalignment or dimensional deviation of the photoresist. However, in the present embodiment, the slit 41ds is formed to surround the wiring layer 39. Accordingly, even when the positional misalignment or dimensional deviation related to the photoresist occurs, the situation in which the slit 41d is not formed to surround the opening of the through-hole 36 can be inhibited.

Third Embodiment

A third embodiment is described in the following. The present embodiment refers to the modification of the protective film 41. Other than that, the third embodiment is similar to the first embodiment. Therefore, the description of the common features in the first and third embodiments is omitted.

Figure 9:
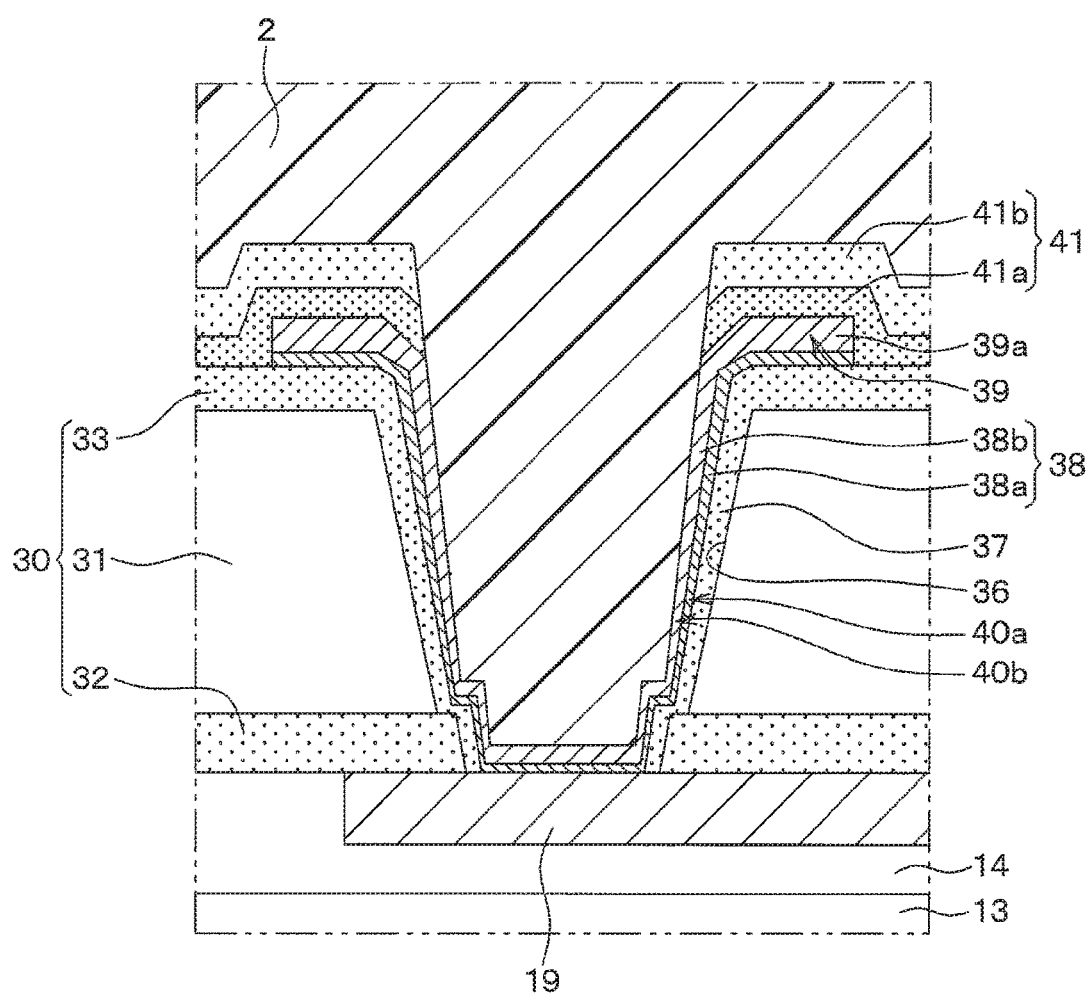
FIG. 9 is a cross sectional view of the vicinity of a through-hole of a semiconductor device according to a third embodiment.

In the present embodiment, as illustrated in FIG. 9, the protective film 41 is not arranged on the wall surface of the through-hole 36. That is, it is configured such that the protective film 41 is not arranged at the location where the stress is concentrated, in other words, the location where the crack easily occurs. It is noted that FIG. 9 corresponds to an enlarged view of the region A illustrated in FIG. 1.

Accordingly, the occurrence of cracks on the protective film is reduced by not providing the protective film 41 at the location where the stress is concentrated.

OTHER EMBODIMENTS

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, in each of the above-mentioned embodiments, the through-electrode 38 and the wiring layer 39 may be configured by only one metal film, and the protective film 41 may only be configured by only one layer.

In each of the above-mentioned embodiments, the lower protective film 41a and the insulation film 33 may be configured by different materials. In this situation, with regard to the second embodiment, when the lower protective film 41a and the insulation film 33 are configured by different materials, the crack is hardly to be conducted to the insulation film 33 even though the crack occurs at the lower protective film 41a. Accordingly, the slit 41d may be only formed at the protective film 41.

Moreover, in each of the above-mentioned embodiments, the number of through-holes 36 may be modified according to the number of the connectors 19 to 21 formed on the sensor substrate 10 as appropriate.

In each of the above-mentioned embodiments, the recess 15 may be formed from the support substrate 11 to the insulation film 12, and the diaphragm may be configured by only the semiconductor layer 13.

The invention claimed is:
1. A semiconductor device having a first substrate and a second substrate bonded together, the semiconductor device comprising:
the first substrate having a first surface at which a plurality of connectors are arranged;
the second substrate including a first surface and a second surface, the second surface being an opposite surface of the first surface of the second substrate, the second substrate stacked on the first substrate by bonding the first surface of the second substrate and the first surface of the first substrate together, the second substrate formed with a plurality of through-holes correspondingly exposing the connectors, each through-hole formed in a direction in which the first substrate and the second substrate are stacked;
a plurality of through-electrodes correspondingly arranged at the through-holes, the through-electrodes electrically connected with the connectors correspondingly; and
a protective film integrally covering the through-electrodes, wherein each of the protective film and the through-electrodes has a shape of a contour of a respective wall surface of a respective through-hole, wherein the protective film has a plurality of slits, each slit having a frame shape to surround an opening of the each through-hole when viewed in a normal direction with respect to the first surface of the first substrate, and wherein the protective film is separated by the slit into a region inside the slit and a region outside the slit.

2. The semiconductor device according to claim 1, further comprising:

a wiring layer electrically connected with each of the through-electrodes, the wiring layer arranged on the second surface of the second substrate, wherein the slit penetrates the protective film to expose the wiring layer in the frame shape.

3. The semiconductor device according to claim 1, further comprising a wiring layer electrically connected with each of the through-electrodes, the wiring layer arranged on the second surface of the second substrate, wherein the slit surrounds both of the wiring layer and the opening of the each through-hole.

4. The semiconductor device according to claim 3, wherein the second substrate further includes an insulation film at a side with respect to the second surface of the second substrate, wherein the wiring layer is arranged on the insulation film, wherein the protective film covers the through-electrodes and the wiring layer, wherein the insulation film and one portion of the protective film in contact with the insulation film are configured by a same material, and wherein the slit penetrates both of the protective film and the insulation film to separate the both of the protective film and the insulation film into the region inside the slit and the region outside the slit.

5. The semiconductor device according to claim 1, wherein the protective film, which is arranged at a border region between a bottom surface and a side surface of the each through-hole, is configured to be applied by a stress larger than or equal to 1240 MPa.

* * * * *